US006299390B1

(12) United States Patent
Ammann

(10) Patent No.: US 6,299,390 B1
(45) Date of Patent: Oct. 9, 2001

(54) HEADPIECE FOR MACHINE TOOLS THAT PRODUCE MULTIPLE HOLES

(75) Inventor: Beat Ammann, Sagno (CH)

(73) Assignee: Ballado Investments Inc. (PA)

( * ) Notice: Subject to any disclaimer, the term of this patent is extended or adjusted under 35 U.S.C. 154(b) by 0 days.

(21) Appl. No.: 09/469,324

(22) Filed: Dec. 22, 1999

(51) Int. Cl.[7] .................................................. B23B 47/34
(52) U.S. Cl. ............................... 408/67; 408/57; 408/59; 409/131
(58) Field of Search .............................. 408/57, 58, 59, 408/67, 241 G; 409/131, 137, 140; 144/252.1, 252.2

(56) References Cited

U.S. PATENT DOCUMENTS

| 4,909,293 | * | 3/1990 | Maioli | 408/67 X |
| 4,921,375 | * | 5/1990 | Famulari | 408/67 |
| 4,986,703 | * | 1/1991 | Hampl et al. | 409/131 |
| 5,356,245 | * | 10/1994 | Hosoi et al. | 408/56 |
| 6,079,078 | * | 6/2000 | Byington | 408/67 X |

* cited by examiner

Primary Examiner—Henry Tsai
(74) Attorney, Agent, or Firm—Young & Thompson

(57) ABSTRACT

The headpiece is equipped with an aspiration system for continuously sucking up and removing shavings that are formed during machining of a flat board. To the headpiece are attached one or more shaft-like elements, which push on the board that is to be drilled via one of their elastically yielding edges, thus leaving exposed and encompassed between them an area of the board where the holes are to be made. A box, which is open toward the area where the holes are to be made and to which the aspiration system is to be fitted, is attached, over its entire length, to at least one of the shaft-like elements.

6 Claims, 2 Drawing Sheets

HEADPIECE FOR MACHINE TOOLS THAT PRODUCE MULTIPLE HOLES

FIELD OF THE INVENTION

This invention pertains to the field of machine tools and, more specifically, to the part of that field that deals with machines that make multiple perforations at high speed, creating multiple holes on flat boards such as, for example, those that act as mechanical supports and insulators for conductors on printed circuit boards.

These machines must necessarily be equipped with one or more headpieces, i.e., one or more devices that keep the board to be drilled stationary by causing it to adhere, in a perfectly flat manner, to a support and reference table. The invention pertains to a headpiece of the above-described type, but with innovative characteristics that make it possible to achieve the extremely advantageous effect of appropriately increasing the machine's efficiency, which depends to a substantial extent on the number of perforations that can be produced in a reference unit of time.

BACKGROUND OF THE INVENTION

Today's headpieces, which are equipped with a pneumatic system for sucking up the shavings that are produced during machining, move continuously, pressing from time to time on the area of the board to be machined where a hole is to be made.

The total amount of time that it takes to make a single hole therefore consists of the time that it takes the headpiece to reach the board starting from an initial standby position and the time it takes the headpiece to retract. The time required for the drilling per se therefore lies within this interval and is shorter than the latter, since the tip rests on the board to be drilled only after the headpiece has finished being compressed against an elastic packing with which it is equipped; this packing has to be used in order to avoid damaging the board itself and to ensure that uniform pressure is exerted on said board over the entire contact surface.

The two lengths of time, elastic compression and elastic reexpansion of said packing, are therefore dead times that are added to the time that the drilling work itself takes.

In the more common case mentioned above, where machining is done on printed circuit boards, the work of drilling, which involves advancing a few millimeters in a fairly friable material, lasts an extremely short time for each individual hole, and therefore the dead times involving the actual actuation of the headpiece increase substantially in terms of percentage.

SUMMARY OF THE INVENTION

The inventor of this invention has developed the idea of a headpiece which, although it performs the actual functions that need to be performed and that were described above, does not involve any dead time that is added to that of the actual work of sucking up shavings.

As a matter of fact, a headpiece that is produced according to the invention actually adheres to the entire area of the board where the holes are to be made and therefore does not need to be moved in a cyclic fashion per se to help with drilling that is done in succession in space and time.

A preferred embodiment of a headpiece according to the invention will now be described, whereby, however, this example is neither limiting nor binding with respect to the other embodiments that can be produced by implementing the teachings a contained herein.

BRIEF DESCRIPTION OF THE DRAWINGS

In the description given below, reference will also be made to the attached drawings, where.

DETAILED DESCRIPTION OF THE PREFERRED EMBODIMENTS

Figure 1:
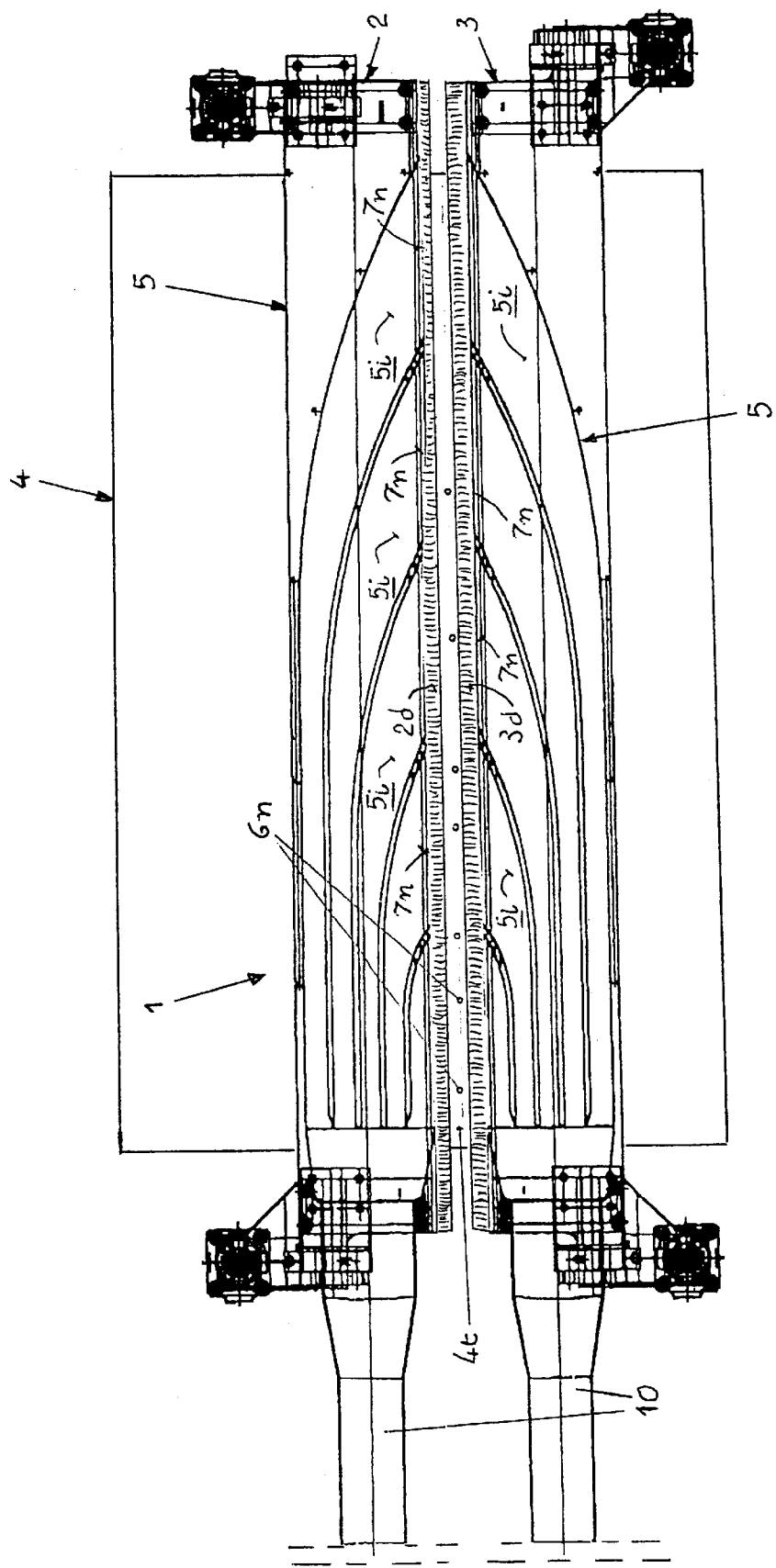
FIG. 1 shows a partially cut-away frontal view of the embodiment of a headpiece according to the invention.

FIG. 1 shows how, to a headpiece 1 according to the invention, one or more shaft-like elements 2, 3 (two in the example in question), which push on board 4 that is to be drilled via its elastically yielding edge 2d, 3d (which bends, in this case), are attached, thereby exposing area 4t of said board 4 where multiple aligned holes 6n are to be made. In the case in question, said two shaft-like elements 2, 3 are arranged horizontally and parallel to one another so as to leave a linear area 4t of board 4 exposed and accessible to drilling tips 11 (see FIG. 2).

All of perforations 6n that are to be made in said area 4t can be made without having later to move headpiece 1, which has to be disengaged only after the machining of board 4 has been completed.

As regards the aspiration that is required to remove the shavings, to a headpiece 1 according to the invention an aspiration system 10 can is attached, in such a way as to create in it an appropriate underpressure at two boxes 5, which have one or more holes 7n facing area 4t that is located between shaft-like elements 2, 3 where the shavings are created during the machining of the holes.

The shavings, assisted by the force of gravity acting on them, are mainly sucked up into lower box 5 and are then removed toward a collection area (not shown in the drawing, since it is such a common item). The other shavings, which are driven upward by centrifugal or other forces, are aspirated into other box 5, located above.

In order to ensure more efficient operation of the shaving removal system, it is preferable to create, at the edge of each box 5 that faces toward corresponding shaft-like elements 2, 3, several holes 7n, which are arranged appropriate distances apart and to which lead an equal number of compartments 5i of said boxes 5 that are attached to aspiration system 10.

In order to achieve an aspiration effect that is uniform and balanced over the entire length of area 4t where the perforations are made, it is necessary to shape and size compartments 5i such that in each of them there are identical overall losses of load to the air that flows through them carrying the shavings.

One possible solution was created with compartments 5i made as indicated in cutaway view in FIG. 1.

Figure 2:
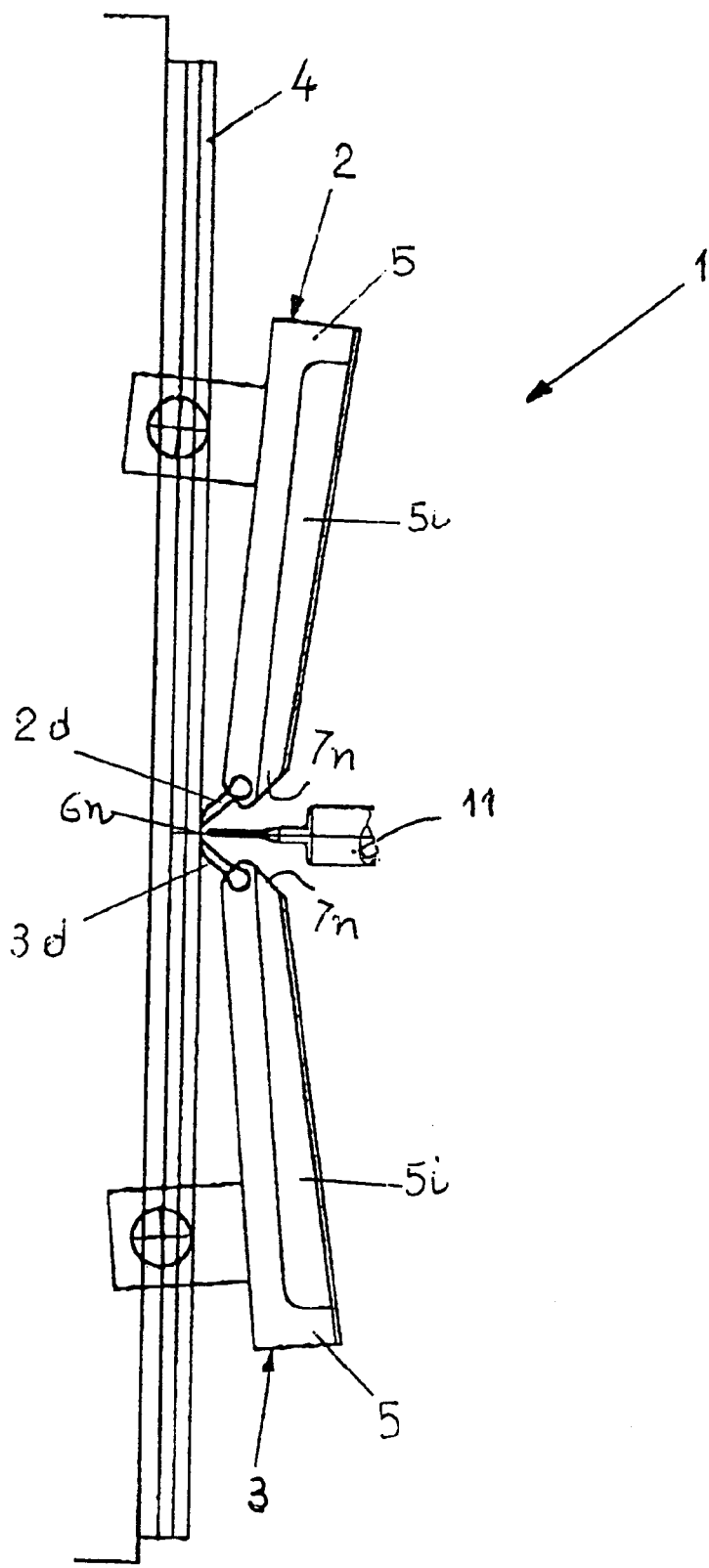
FIG. 2 shows a partial view of an enlarged cross-section of said headpiece.

With regard to edges 2d, 3d of above-mentioned shaft-like elements 2, 3 which yield elastically to bending, the inventor proposes that they be made in the form of flexible brushes 2d, 3d that are tilted as shown in FIG. 2, i.e., in such a way as to direct the shavings that are formed toward above-mentioned holes 7n in boxes 5 that are attached to aspiration system 10.

It turns out to be especially advantageous to use brushes made up of bristles as shown to produce elastically yielding edges 2d, 3d when it comes to cleaning shaft-like elements 2, 3 of the machine tool on which a headpiece according to the invention is used, since the shavings are unable to adhere to the machine tool to later filter into its structure, and in

What is claimed is:

1. Headpiece for a machine tool that produces a series of holes by removal of shavings on a flat board, the headpiece comprising:

one or more shaft-like elements having an elastically yielding edge pushing on the board and leaving exposed an area of the board where holes are to be made;

a box attached to each of said shaft-like elements and open toward the area where holes are to be made; and an aspriration system attached to said box and creating in said box an underpressure to aspirate the shavings, wherein each box comprises a series of openings that lead to an equal number of compartments, which are in turn independently connected to said aspiration system.

2. Headpiece according to claim 1, wherein each of said compartments is of such a shape and size that the underpressure in each compartment is identical.

3. Headpiece according to claim 1, wherein there are two of said shaft-like elements arranged horizontally and parallel to one another.

4. Headpiece according to claim 1, wherein said elastically yielding edge of each of said shaft-like elements is made with bristles that form a flexible brush, whereby the bristles themselves are pressed obliquely against the board.

5. Headpiece according to claim 4, wherein said flexible brushes are tilted in such a way as to direct shavings that are formed toward said openings in respective boxes that are attached to said aspiration system.

6. Headpiece for a machine tool that produces a series of holes by removal of shavings on a flat board, the headpiece comprising:

two movable, shaft-like elements arranged horizontally and parallel to each other and each having an elastically yielding edge pushing on the board and leaving between the two edges an exposed area of the board where holes are to be made;

a box attached to each of said shaft-like elements and open toward the exposed area where holes are to be made; and an aspiration system attached to each box and creating in said box an underpressure to aspirate the shavings.

* * * * *